United States Patent

Mori

[11] Patent Number: 5,774,800
[45] Date of Patent: Jun. 30, 1998

[54] RADIO COMMUNICATION APPARATUS WITH REFERENCE FREQUENCY CONTROL BASED ON STORED CHARACTERISTIC CONTROL DATA

[75] Inventor: Kazuhiro Mori, Tokyo, Japan

[73] Assignee: Mitsubishi Denki Kabushiki Kaisha, Tokyo, Japan

[21] Appl. No.: 609,173

[22] Filed: Mar. 1, 1996

[30] Foreign Application Priority Data

Mar. 29, 1995 [JP] Japan ................................. 7-071264

[51] Int. Cl.⁶ .............................. H04B 1/06; H04B 7/00
[52] U.S. Cl. ......................... 455/255; 455/69; 455/316
[58] Field of Search ................................. 455/254, 255, 455/256, 257, 258, 263, 264, 208, 164.1, 164.2, 313, 316, 318, 67.1, 67.2, 67.4, 69, 310; 331/176, 177 R

[56] References Cited

U.S. PATENT DOCUMENTS

| | | | |
|---|---|---|---|
| 4,893,097 | 1/1990 | Zwack | 331/176 |
| 4,921,467 | 5/1990 | Lax | 455/264 |
| 4,932,072 | 6/1990 | Toko . | |
| 5,204,972 | 4/1993 | Hashimoto | 455/264 |
| 5,477,194 | 12/1995 | Nagakura | 331/176 |
| 5,493,710 | 2/1996 | Takahara et al. | 455/265 |

FOREIGN PATENT DOCUMENTS

| | | | |
|---|---|---|---|
| 483090 | 4/1992 | European Pat. Off. . | |
| 0560475A1 | 9/1993 | European Pat. Off. | 455/75 |
| 9016113 | 12/1990 | WIPO . | |
| 9624986 | 8/1996 | WIPO . | |

OTHER PUBLICATIONS

European Patent Office, Patent Abstracts of Japan; Publication No. 60149223, Publication Date: Jun. 8, 1995 (One Page).

Primary Examiner—Reinhard J. Eisenzopf
Assistant Examiner—Sam Bhattacharya
Attorney, Agent, or Firm—Rothwell, Figg, Ernst & Kurz

[57] ABSTRACT

A radio communication apparatus includes a control section detecting the frequency of the intermediate-frequency signal from a mixer and adjusting the local oscillation frequency generated by a local oscillator on the basis of the detected intermediate frequency. The adjusted local oscillation frequency is supplied to the mixer to stabilize the intermediate frequency.

9 Claims, 17 Drawing Sheets

|   | TEMPERATURE | A/D INPUT | A/D OUTPUT | RECEIVED INFORMATION |
|---|---|---|---|---|
| 1 | 80°C | VAD (1) | VDA (1) | R (1) |
| 2 | 70 | VAD (2) | VDA (2) | R (2) |
| 3 | 60 | VAD (3) | VDA (3) | R (3) |
| 4 | 50 | VAD (4) | VDA (4) | R (4) |
| 5 | 40 | VAD (5) | VDA (5) | R (5) |
| 6 | 25 | VAD (6) | VDA (6) | R (6) |
| 7 | 10 | VAD (7) | VDA (7) | R (7) |
| 8 | 0 | VAD (8) | VDA (8) | R (8) |
| 9 | -10 | VAD (9) | VDA (9) | R (9) |
| 10 | -20 | VAD (10) | VDA (10) | R (10) |
| 11 | -30 | VAD (11) | VDA (11) | R (11) |

Fig. 16

| NO. | A/D INPUT | D/A OUTPUT |
|---|---|---|
| 1 | 225 | 125 |
| 2 | 215 | 135 |
| 3 | 200 | 140 |
| 4 | 180 | 140 |
| 5 | 155 | 135 |
| 6 | 125 | 125 |
| 7 | 95 | 115 |
| 8 | 70 | 110 |
| 9 | 50 | 110 |
| 10 | 35 | 115 |
| 11 | 25 | 125 |

Fig. 18

| NO. | A/D INPUT | D/A OUTPUT |
|---|---|---|
| 1 | 225 | 125 |
|  | 224 | 126 |
|  | 223 | 127 |
|  | 222 | 128 |
|  | 221 | 129 |
|  | 220 | 130 |
|  | 219 | 131 |
|  | 218 | 132 |
|  | 217 | 133 |
|  | 216 | 134 |
| 2 | 215 | 135 |

⇧ PAIR OF DATA STORING POINT

LINEAR CALCULATION AREA

⇧ PAIR OF DATA STORING POINT

RADIO COMMUNICATION APPARATUS WITH REFERENCE FREQUENCY CONTROL BASED ON STORED CHARACTERISTIC CONTROL DATA

BACKGROUND OF THE INVENTION

1. Field of the Invention

The present invention relates to a radio communication apparatus for use in an automobile telephone, a portable telephone or the like, and a method for adjusting the apparatus and more particularly to a method for correcting a frequency relative to temperature.

2. Description of the Prior Art

In a portable telephone system, a multiplicity of channels are used so as to make effective use of frequencies. For instance, in the AMPS system, which is one analog system in the United States, a received frequency $f_{RX}$ is expressed as $$869.04 + 0.03 \times n [MHz]$$

(where n=0~831),
while a transmitting frequency $F_{TX}$ is expressed as $$824.04 + 0.03 \times n [MHz]$$

(where n=0~831).
Mobile terminal equipment (a portable telephone) is required to function to perform reception and transmission for an arbitrary n.

In this AMPS system, since the frequency interval between respective channels is as narrow as 0.03 [MHz]=30 [KHz], the transmitting frequency is required to be highly accurate. The required frequency accuracy in the AMPS system is ±2.5 ppm (−30° C.~65° C.). It follows from this that $$824.04[MHz] \times 2.5 \text{ ppm} = 824.04 \times 10^6 \times 2.5 \times 10^{-6} = 2060.1[Hz],$$

results in a permissible tolerance of a transmitting frequency of 824.04±0.0020601 [MHz].

Since a frequency accuracy described as above is required, a PLL frequency synthesizer is used as an oscillation source in the mobile terminal equipment. The PLL can output a signal of $f_o = n \times f_r / L$ (where n and L are arbitrary natural numbers, which are programmable) when a reference frequency $f_r$ is inputted. For instance, in a case where a transmission wave for the AMPS system is formed, assuming $f_r$=14.85 (MHz), the value of L and n will be L=495 and n=27468~28299. In this case, $f_o$ has the same frequency accuracy as that of $f_r$.

Consequently, a reference frequency generation source is required to have a frequency accuracy which is as severe as one required for the transmitting and receiving frequencies. For this reason, in the prior art, components such as TCXO, VCTCXO and DTCXO must be used which has a good frequency accuracy but are expensive.

In the TCXO (Temperature Compensated Crystal Oscillator), a crystal is used as an oscillating resonator and the oscillating frequency accuracy relative to temperature change is improved further than that of a crystal alone by using components such as a thermistor and a varicap (or variable capacitance diode). Although the crystal is a component having a quite good frequency accuracy, its accuracy is only ±15 ppm in a temperature range of −30° C.~75° C.

A DTCXO (Digital TCXO) is intended to correct the frequency of the crystal by using a one-chip microcomputer, a varicap, a D/A converter and the like and its frequency accuracy is better than that of the TXCO. In addition, a VCTCXO (Voltage Controlled TCXO) is a TCXO with a voltage control terminal for fine adjustment of frequency.

As a method for obtaining a required frequency accuracy in the whole of a radio receiving device by constituting a reference frequency oscillation source using an inexpensive crystal, there is one, for example, described in the official gazette of Japanese Patent Laid-Open No. 149223/1985. Referring to FIG. 1, this prior art method will be described below.

A received wave $f_{RX}$ received by an antenna 1 is applied to a mixer 2 in which the received signal is mixed with a local oscillation wave $f_{LO}$ generated by a receiving station local oscillation generating source 4 and then an intermediate frequency $f_{IF}$ is produced. The intermediate frequency $f_{IF}$ is then inputted into a demodulator 3. Here, when there is existing the relationship as expressed by $f_{RX} > f_{LO}$, it is referred to as a down local system, and the following equation is established; $f_{IF} = f_{RX} - f_{LO}$. On the other hand, there is existing the relationship as expressed by $f_{LO} > f_{RX}$, it is referred to as an upper local system, and then the following equation is established; $f_{IF} = f_{LO} - f_{RX}$.

The demodulator 3 outputs a demodulated tuning indication output $V_D$. In a case of FM receiving system, the demodulator 3 is conventionally constituted by a crystal discriminator. The crystal discriminator has characteristics as shown in FIG. 2, and at a tuned point (when $f_{IF}$ is a prescribed frequency) $V_D=0$ [V] is obtained. From this, it is possible to use the tuning indication output $V_D$ as a frequency detecting means for the intermediate frequency.

The receiving station local oscillation generating source 4 generates a local oscillation $f_{LO}$ based on a reference frequency $f_r$. In cases where the PLL system is utilized or where a frequency multiplication is performed, the relationship of $f_{LO} = n \times f_r / L$ is maintained, so that $f_{LO}$ has the same frequency accuracy as that of $f_r$. Although the accuracy of a reference frequency $f_r$ generated by a VCXO 5 is equal to the frequency accuracy of a crystal 501 of the VCXO 5 when a control voltage $V_c$ to be applied remains constant, the reference frequency $f_r$ changes as the control voltage $V_c$ changes. An example of this change is shown in FIG. 3, which shows temperature-to-frequency characteristics of the VCXO 5 when an AT cut crystal is used.

A D/A converter 6 converts a digital value from a CPU 9 into an analog value and then feeds it into the VCXO 5. The DC voltage $V_c$ varies as this digital value varies, so that it is possible to increase and/or decrease the reference frequency $f_r$ with a digital value that is inputted into the D/A converter 6 by the CPU 9.

A temperature detecting means 7 has a thermistor 701 and outputs a voltage $V_T$ corresponding to a temperature. An A/D converter 8 converts this DC voltage $V_T$ into a digital value which is applied to the CPU 9.

The CPU 9 and a RAM 10 detect the tuning indication output $V_D$, control the D/A converter 6 and detect the output voltage $V_T$ from the A/D converter 8. The RAM 10 operates in two modes; an adjustment mode and a control mode. These two modes are changed over by a switch or the like (not shown).

In the adjustment mode, the CPU 9 processes the received wave $f_{RX}$ as a reference signal and controls the reference frequency such that the tuning indication output $V_D$ reaches a tuning point. In other words, if the received wave $f_{RX}$ is constant, then as the reference frequency $f_r$ varies as the DC voltage $V_G$ varies, the receiving station local oscillation $f_{LO}$ varies, then the intermediate frequency $f_{IF}$ varies and the tuning indication output $V_D$ varies, and therefore the CPU 9 changes data for the D/A converter 6 such that it results in $V_D=0$. When $V_D=0$, the intermediate frequency $f_{IF}$ is a prescribed frequency, and simultaneously both the receiving station local oscillation frequency $f_{LO}$ and the reference frequency $f_r$ are set at a prescribed frequency. Thus, the CPU 9 can set frequencies of various signals by using the received wave as the reference signal.

As is described above, the method for adjusting an oscillating frequency in a reference frequency generating source in a radio communication apparatus by using a received wave $f_{RX}$ as a reference is called AFC and is frequently used. For instance, it is used in a conventional portable telephone system such as an NTT system and an N-TACS system.

A point to be noticed in the AFC is that the frequency accuracy of the receiving station local oscillation $f_{LO}$ is the same as the reference frequency $f_r$, while the frequency accuracy of the intermediate frequency $f_{IF}$ is remarkably worse than that of the receiving station local oscillation $f_{LO}$. The following are reasons for this. Let the frequency error (or deviation) of the reference frequency $f_r$ be $\Delta f_r$, the frequency error of the receiving station local oscillation $f_{LO}$ will be $f_{LO} \times \Delta f_r/f_r$. In addition, since $f_{IF}=f_{LO}-f_{RX}$, it follows from this that the frequency error of the intermediate frequency $f_{IF}$ is expressed as $f_{LO} \times \Delta f_r/f_r$. Namely, the frequency errors of $f_{LO}$ and $f_{IF}$ are the same. On the other hand, the frequency accuracy of the receiving station local oscillation $f_{LO}$ is $\Delta f_r/f_r$, and that of the intermediate frequency $f_{IF}$ is $(f_{LO}/f_{IF}) \times (\Delta f_r/f_r)$. In other words, the frequency accuracy of the intermediate frequency $f_{IF}$ is $(f_{LO}/f_{IF})$ times greater than that of the receiving station local oscillation $f_{LO}$. Here, $f_{LO} \gg f_{IF}$, so that the frequency accuracy of the intermediate frequency $f_{IF}$ becomes remarkably worse than that of the receiving station local oscillation $f_{LO}$. This means that the frequency accuracy of the reference frequency $f_r$ can be enlarged in the intermediate frequency $f_{IF}$ upon detection.

The CPU 9 obtains a set value of an output value from the D/A converter 6 and an input value from the A/D converter 8 and stores the set value in the RAM 10 as a pair of data. In addition, the CPU 9 stores pairs of data taken at several suitable temperature levels in the RAM 10.

In the control mode, the CPU 9 adjusts the deviation of the oscillation frequency of the VCXO 5 due to temperature on the basis of these pairs of data stored in the RAM 10. This makes it possible for the VCXO 5 to carry out oscillation in a desirable temperature range and with a desirable frequency accuracy. A temperature-frequency error characteristics is shown in FIG. 4.

A switch 11 is intended to take timing to store pairs of data in the adjustment mode, and for instance it is switched on at desirable temperatures. A battery 12 is a back-up battery for the RAM 10.

The prior art radio communication apparatus is constructed as described above, and if the apparatus is adjusted in the adjustment mode at the time of manufacturing and is put in the control mode when in use in the actual field, it is possible to have the frequency accuracy of the radio apparatus fall within a desired accuracy in the desired temperature range.

Referring to FIG. 5, a conventional method for adjusting the radio communication apparatus will be described below. In FIG. 5, reference numeral 13 denotes a base station for adjustment use and it generates a signal $f_{RX}$ having a high frequency accuracy so as to feed it into an antenna 14.

Reference numeral 15 denotes a switch for taking timings to store pairs of data in the adjustment mode and it integrates the switches 11 of the conventional apparatus (FIG. 1) into one switch. Reference numeral 16 denotes conventional radio apparatuses. Reference numeral 18 denotes a thermostat or thermoregulator in which the temperature can freely be adjusted so as to be increased or decreased. There are disposed in the thermoregulator 18 a number of radio apparatuses 16 and antenna 14. The base station 13 is disposed outside the thermoregulator 18.

First, a number of radio apparatuses which are set in the adjustment mode are disposed in the thermoregulator 18. Next, the temperature of the thermoregulator 18 is changed within a predetermined range at predetermined intervals. For instance, the temperature is set such that it changes within a range of $-30°$ C.$\sim 80°$ C. in increments of $10°$ C. After the temperature of the thermoregulator 18 is so set, nothing is done until the temperature in the thermoregulator stabilizes. When the temperature becomes stable at the adjusting point temperature, the switch 15 is pressed for storing a pair of data at this particular temperature.

In current portable and wireless telephone using the analog system, modulation and demodulation of narrowband FM is performed, but the demodulating circuit section of receivers of almost all of those telephones adopt a quadrature detecting system, and this circuit section as well as other functions are integrated using IC's. Furthermore, in many cases a discriminator is constituted by inductors (L) and capacitors (C) in order to reduce costs. A demodulating circuit constructed as described above does not exhibit characteristics as shown in FIG. 2.

For instance, the tuning indication output differs from the above-mentioned demodulator in that:

(1) It does not become 0V at a tuned point but takes a predetermined voltage, and that;

(2) It varies due to temperature.

Therefore, if such a demodulator is applied to the above radio communication apparatus, the tuning indication output of the demodulator as a means for detecting intermediate frequencies varies according to temperature. In order to correct this variation, the tuning indication output needs to be stored in the RAM at each temperature and it is very inconvenient in terms of adjustment.

Furthermore, since in the conventional radio apparatus the tuning indication output functions as a means for detecting intermediate frequencies, it is difficult to quantify the detection accuracy of intermediate frequencies and therefore it is inconvenient in guaranteeing a designed frequency accuracy.

In addition, in the prior art method for adjusting the radio apparatus, since the timing when a pair of data are stored in the adjustment mode is given by operating the switch 15, the following problems are caused:

(1) The switch 11 is needed for each radio apparatus 16, and this increases costs;

(2) The switch 15 needs to be pressed at predetermined temperatures in order to store pairs of data in the adjustment mode; and (3) Although it is desirable to adjust simultaneously a number of radio apparatuses from a productivity point of view, since the respective switches 11 of the apparatuses 16 are connected to the single switch 15, cables equal to the number of apparatuses 16 are needed.

SUMMARY OF THE INVENTION

The present invention was made to solve the above problems and an object thereof is to provide a radio communication apparatus capable of reducing a variation in frequency caused by variation in temperature to thereby realize stable operation, and to provide a radio communication apparatus which can be easily adjusted so as to reduce a variation in frequency caused by a variation in temperature and a method for adjusting the apparatus.

According to a first feature of the present invention, a radio communication apparatus comprises an antenna, a mixer for mixing a received signal from the antenna and a local oscillation signal inputted from the outside so as to output an intermediate-frequency signal, a demodulator for demodulating a signal based on the intermediate-frequency signal, a control section for detecting the frequency of the intermediate-frequency signal so as to output a control signal, a reference signal generator for generating a reference signal based on the control of the control section, and a local oscillation signal generator for generating the local oscillation signal based on the reference signal for supply to the mixer.

In accordance with the first feature, the mixer mixes a received signal from the antenna and a local oscillation signal inputted from the outside so as to output an intermediate-frequency signal, the demodulator performs demodulation on the basis of the intermediate-frequency signal, the control section detects the frequency of the intermediate-frequency signal so as to output a control signal, the reference signal generator produces a reference signal on the basis of the control signal, and the local oscillation signal generator produces the local oscillation signal based on the reference signal for supply to the mixer.

According to a second feature of the present invention, the radio communication apparatus further comprises a temperature detecting means for detecting the internal temperature and applying the temperature signal to the control section, wherein in an adjustment mode, the control section stores the control signal outputted to the reference signal generator and the temperature signal outputted from the temperature detecting means as a pair of data when the frequency of the intermediate-frequency signal falls within a predetermined range, while in a control mode the control section controls the frequency of the reference signal while performing temperature correction based on the pair of data.

In accordance with the second feature, the temperature detecting means detects an internal temperature and supplies the temperature signal to the control section, and in an adjustment mode the control section stores the control signal supplied to the reference signal generator and the temperature signal outputted from the temperature detecting means as a pair of data when the frequency of the intermediate-frequency signal falls within a predetermined range, while in a control mode the control section controls the frequency of the reference signal while performing temperature correction based on the pair of data.

According to a third feature of the present invention, the control section is constructed such that the control signal supplied to the reference signal generator and the temperature signal generated by the temperature detecting means are stored as a pair of data when a demodulation signal received from the demodulator and a predetermined signal coincide with each other.

In accordance with the third feature, the control sectional receives the demodulation signal from the demodulator and stores the control signal supplied to the reference signal generator and the temperature signal generated by the temperature detecting means as a pair of data when the demodulation signal and a predetermined signal coincide with each other.

According to a fourth feature of the present invention, the radio communication apparatus further comprises a temperature data storing means in which temperature data is stored in advance, and a temperature determining means for comparing the temperature data with the temperature signal and outputting a pair-of-data storing instruction signal by which the control signal supplied to the reference signal generator and the temperature signal generated by the temperature detecting means are stored as a pair of data when the two signals coincide with each other.

In accordance with the fourth feature, the temperature determining means compares the temperature data with the temperature signal and produces a pair-of-data storing instruction signal to cause the control section to store the control signal supplied to the reference signal generator and the temperature signal from the temperature detecting means as a pair of data when the compared temperature data and the signal coincide with each other.

According to a fifth feature of the present invention, the control section is constructed such that it is temporarily put in the adjustment mode in the actual field, and the pair of data are rewritten by the control signal supplied to the reference signal generator and the temperature signal generated by the temperature detecting means which are obtained on the basis of radio waves received from a base station in the adjustment mode.

In accordance with the fifth feature, the control section is constructed so as to be temporarily put in the adjustment mode in the actual field, and the control section rewrites the pair of data using the control signal supplied to the reference signal generator and the temperature signal generated by the temperature detecting means which are obtained with respect to radio waves received from a base station in the adjustment mode.

According to a sixth feature of the present invention, the control section performs temperature correction by carrying out an interpolating process based on the stored pair of data when there is no pair of data corresponding to the temperature signal.

In accordance with the sixth feature, the control section performs temperature correction by carrying out an interpolation processing based on the stored pair of data when there is no pair of data corresponding to the temperature signal.

According to a seventh feature of the present invention, a method for adjusting the radio communication apparatus comprises the steps of increasing or decreasing the internal temperature of a thermoregulator to a predetermined value, determining whether or not the internal temperature of the thermoregulator reaches the predetermined temperature, instructing from a base station disposed outside of the thermoregulator a plurality of radio communication apparatuses disposed in the thermoregulator to store a pair of data upon reaching the predetermined temperature, transmitting signals from the base station to the plurality of apparatuses, and setting the temperature of the thermoregulator from the base station.

In accordance with the seventh feature, the internal temperature of a thermoregulator is increased or decreased to a predetermined value, whether or not the internal temperature reaches the predetermined temperature is determined, it is instructed from a base station disposed outside of the thermoregulator that a plurality of apparatuses disposed in the thermoregulator should store a pair of data, signals are transmitted from the base station to the plurality of apparatuses, and the temperature of the thermoregulator is set from the base station.

According to an eighth feature of the present invention, the adjustment is performed in a temperature range wider than the required temperature range.

BRIEF DESCRIPTION OF THE DRAWINGS

The foregoing features and other features of the invention are explained in the following detailed description in connection with the accompanying drawings wherein:

FIG. 16 shows an example of a pair of data used in a radio communication apparatus according to another embodiment of the present invention;

FIG. 18 shows an example of an interpolated pair of data for use in the apparatus according to the present invention.

DETAILED DESCRIPTION OF THE PREFERRED EMBODIMENTS

Figure 1:
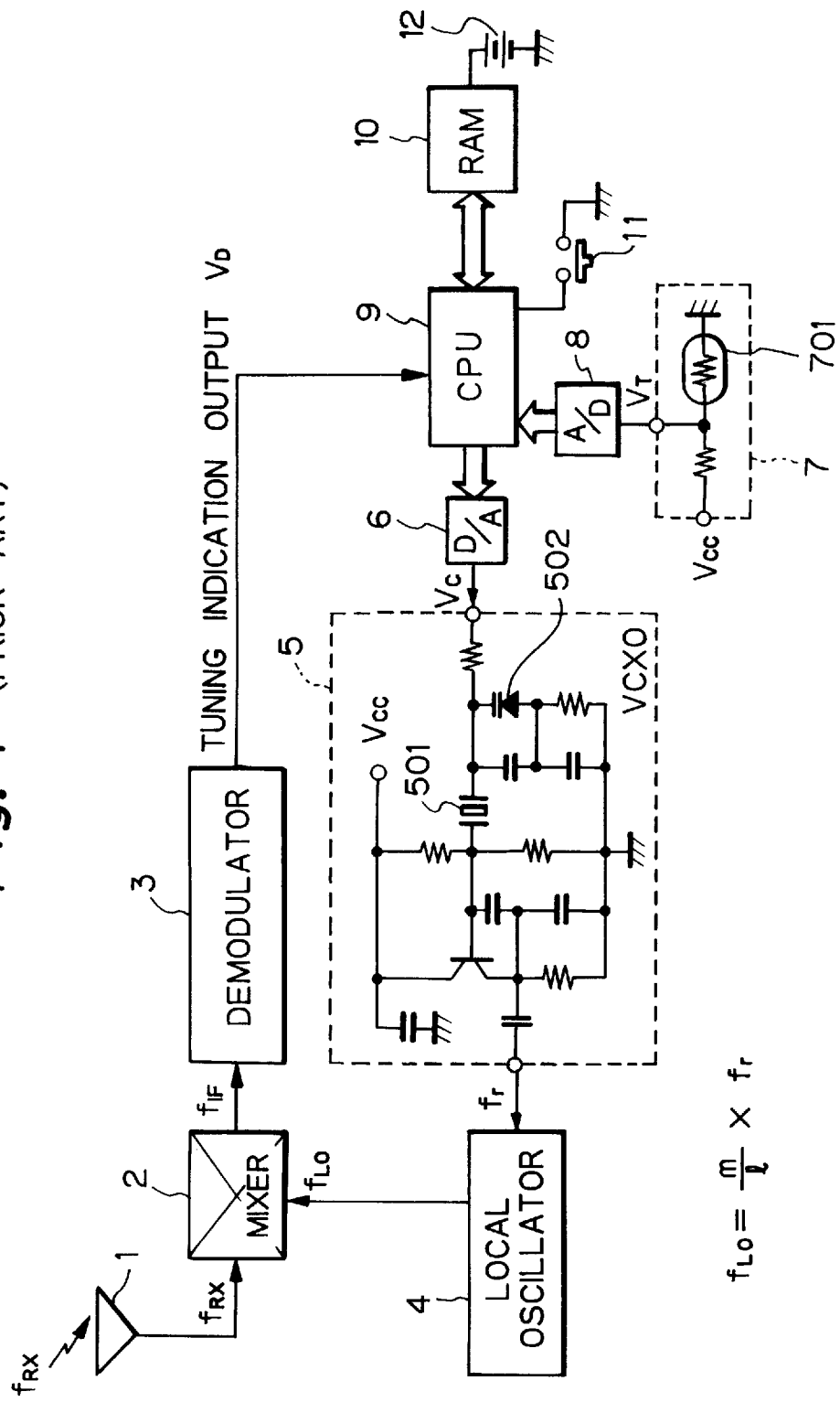
FIG. 1 is a functional block diagram of a conventional radio communication apparatus.
Figure 6:
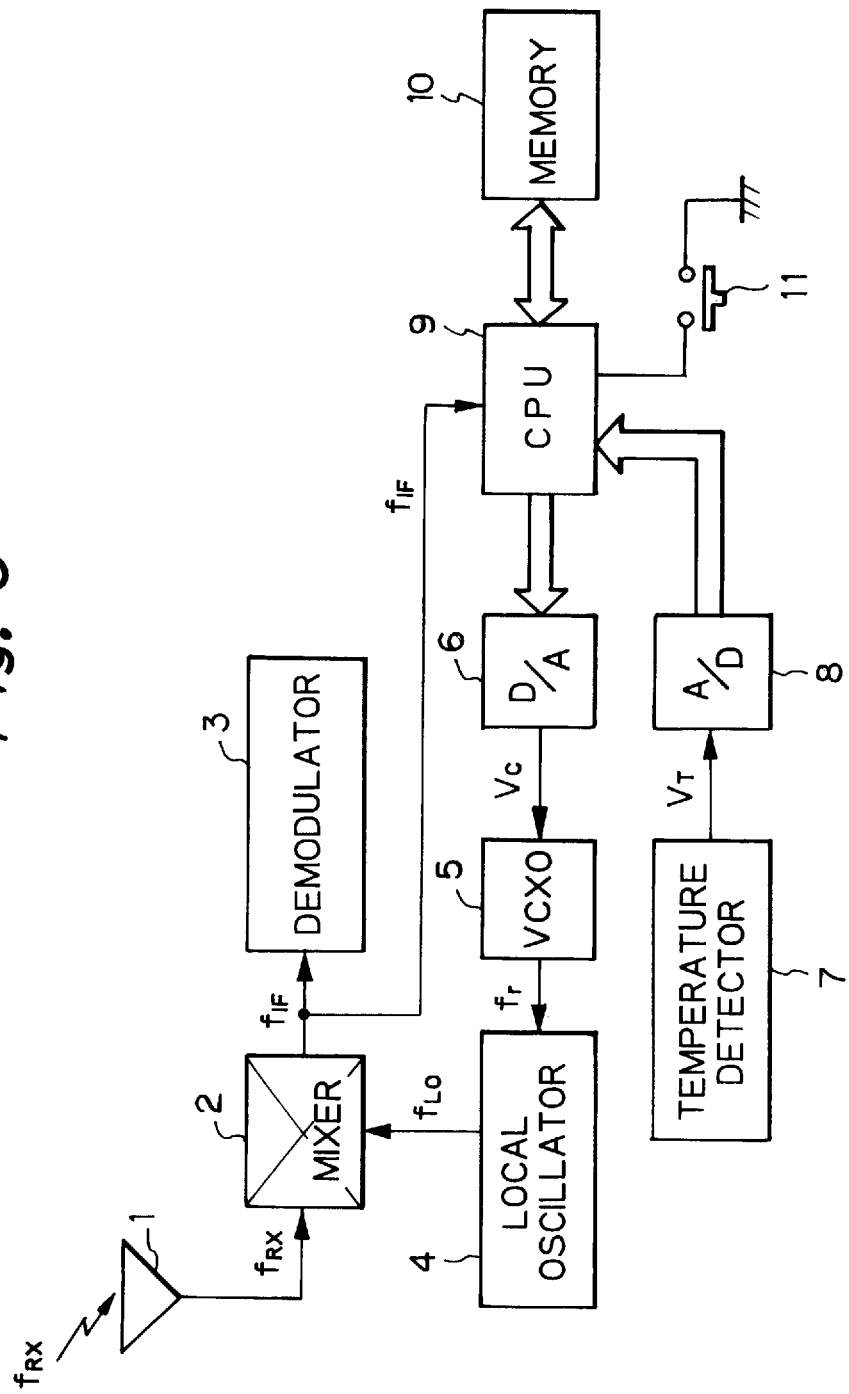
FIG. 6 is a functional block diagram of a radio communication apparatus according to an embodiment of the present invention.

A first embodiment of the present invention will be explained with reference to FIG. 6. In FIG. 6, the radio communication apparatus includes an antenna 1, a mixer 2 for mixing a received signal $f_{RX}$ supplied from the antenna 1 and a local oscillation wave $f_{LO}$ and then producing an intermediate-frequency signal $f_{IF}$, and a demodulator 3 for demodulating the intermediate-frequency signal $f_{IF}$. The local oscillation wave $f_{LO}$ is generated by a receiving station local oscillation source 4. The apparatus further includes a VCXO 5 for feeding a reference signal $f_r$ to the local oscillation source 4, a D/A converter for outputting a control voltage $V_c$ for controlling the frequency $f_r$ of a reference signal generated by the VCXO 5, a temperature detecting circuit 7 for detecting a temperature inside the apparatus and outputting a temperature voltage $V_T$, and an A/D converter 8 for converting the temperature voltage $V_T$, which is an analog signal, into a digital signal. A CPU 9 receives the intermediate-frequency signal $f_{IF}$ from the mixer 2 and the temperature data from the A/D converter 8 and supplies data to the D/A converter 6 so that the D/A converter 6 generates a control voltage $V_c$ on the basis of the data. A memory element 10 is accessed by the CPU 9 and a switch 11 provides the CPU 9 with a timing to store a pair of data in an adjustment mode, in the same manner as in FIG. 1.

An operation of the radio communication apparatus shown in FIG. 6 will next be described. The mixer 2 mixes a received wave $f_{RX}$ with a local oscillation wave $f_{LO}$ and produces an intermediate-frequency signal $f_{IF}$. In the case of a down local system, $f_{IF}=f_{RX}-f_{LO}$, and in the case of an upper local system, $f_{IF}=f_{LO}-f_{RX}$. Here, the CPU 9 controls the local oscillation frequency $f_{LO}$ based on the intermediate-frequency signal $f_{IF}$ so that the intermediate frequency becomes constant.

In other words, the CPU 9 applies digital data to the D/A converter 6 so as to generate a predetermined control voltage $V_c$. Based on this control voltage $V_c$, the oscillation frequency $f_r$ of the VCXO 5 varies, and furthermore the local oscillation frequency $f_{LO}$ varies. The CPU 9 monitors the intermediate frequency $f_{IF}$ and suitably adjusts the digital data given to the D/A converter 6 in such a manner that the intermediate frequency stays constant.

In addition, the CPU 9 performs a temperature compensation based on the temperature data from the A/D converter 8 in such a manner that the intermediate frequency $f_{IF}$ stays constant even if the temperature changes.

In the radio communication apparatus according to the first embodiment, the CPU 9 monitors the intermediate frequency $f_{IF}$ by counting the same. In contrast to this, in the prior art, the CPU 9 monitors the tuning indication output $V_D$. Therefore, in accordance with the apparatus of this embodiment, even if the output of the demodulator changes as the temperature changes, the control of frequency of the CPU 9 is not affected by that. Consequently, the stability of the apparatus with respect to temperature according to the first embodiment becomes remarkably good. Furthermore, in addition to this, a discriminator in a demodulating circuit can be constituted by an inductor and a capacitor instead of a crystal oscillator that has good temperature stability but is expensive, thereby making it possible to reduce costs.

In addition, as described above, it is possible to enlarge the effect of deviation of the reference frequency $f_r$ by a factor of $(f_{LO}/f_{IF})$ in performing detection of $F_{IF}$ ($f_{LO} \gg f_{IF}$). Therefore, it becomes easy to guarantee the detection accuracy of the CPU 9.

Furthermore, as described above, since the frequency accuracy of the intermediate frequency $f_{IF}$ becomes $f_{LO}/f_{IF}$ times worse than that of the reference frequency $f_r$, it is possible to use the reference frequency $f_r$ as a clock for the CPU 9. The accuracy of the reference frequency $f_r$ is in the order of ten's PPM. In addition, in a case where another crystal is used as a clock for the CPU 9, in many cases it is most unlikely that the accuracy thereof becomes the crux of a matter. For instance, if the local oscillation frequency $f_{LO}$=914.00 [MHz] and the intermediate frequency $f_{IF}$=455 [KHz], $f_{LO}/f_{IF} \approx 2000$. In this case, if the reference frequency $f_r$ deviates by 1 ppm, this means that the intermediate frequency $f_{IF}$ deviates by 2000 ppm. It is usual that a crystal having an accuracy in the order of 100 ppm is used as a clock for the CPU 9.

Next, a second embodiment will be explained, wherein a timing to store a pair of data in the adjustment mode is given to the CPU 9 by received information, and the switch 11 of the apparatus shown in FIG. 6 is obviated.

Figure 7:
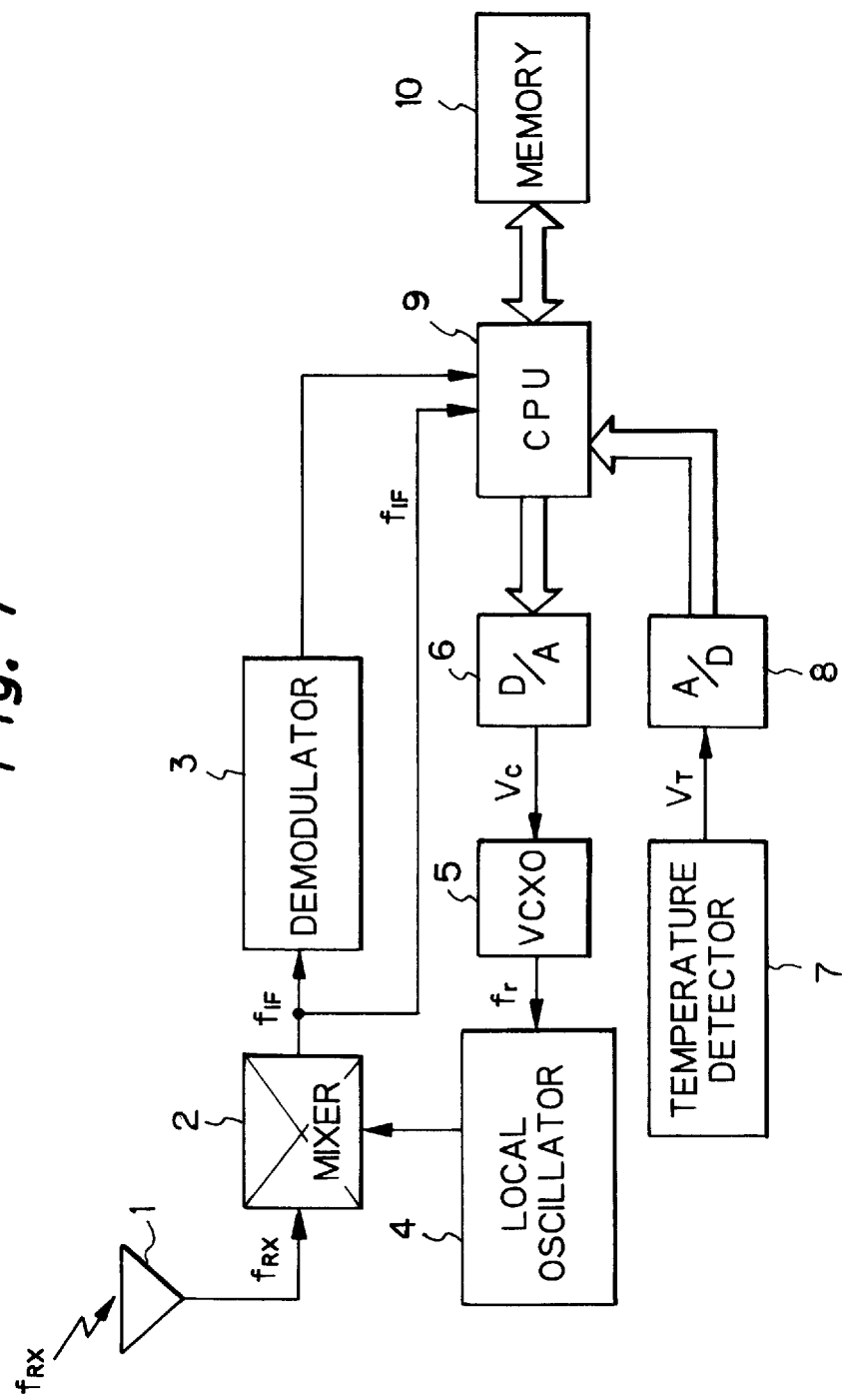
FIG. 7 is a functional block diagram of a radio communication apparatus according to another embodiment of the present invention.

FIG. 7 is a functional block diagram of the radio communication apparatus according to the second embodiment. The radio apparatus shown in FIG. 7 differs from the apparatus shown in FIG. 6 in that there is no switch 11 in the former, that instead of there being such a switch a demodulation output produced by the demodulator 3 is inputted into a CPU 9, and that the CPU 9 takes a timing to store a pair of data in the adjustment mode based on that demodulation output, in other words, received information. Namely, when receiving a specific code from the demodulator 3, the CPU 9 stores in a memory element 10 a pair of data comprising the control voltage for controlling a VCXO 5 and the temperature data from a temperature detecting circuit 7.

Figures 8, 9:
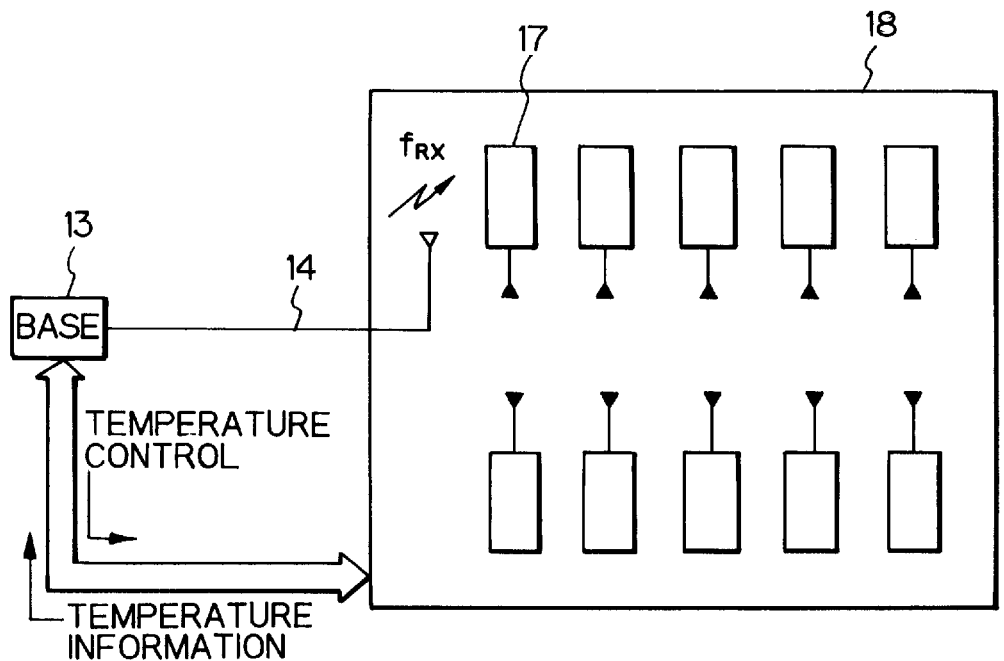
FIG. 8 is a diagram illustrating an adjustment method for the apparatus shown in FIG. 7.
FIG. 9 shows an example of a pair of data used in the apparatus shown in FIG. 7.

Referring to FIG. 8, an adjustment method employed by the apparatus of the second embodiment in the adjustment mode will be described.

In FIG. 8, the temperature in a thermoregulator 18 can be freely increased and/or decreased. A base station 13 generates a signal $f_{RX}$ having a high frequency accuracy and feeds it into an antenna 14. A number of apparatuses 17 disposed in the thermoregulator 18 receive a signal irradiated by the antenna 14.

The base station 13 receives internal temperature information from the thermoregulator 18, whereby it can detect the internal temperature of the thermoregulator 18. Furthermore, the base station 13 can control the internal temperature of the thermoregulator 18. In addition, the base station 13 can indicate a timing to store a pair of data at a specific time to each of the multiplicity of apparatuses 17 in the thermoregulator 18 by using a signal $f_{RX}$ which is produced by modulating a predetermined code.

An example of pairs of data stored at such a time is shown in FIG. 9. In FIG. 9, VAD(X) and VDA(X) are variables for storing an A/D input value and a D/A output value, respectively. In addition, R(X) indicates received information.

Here, in FIG. 8, let pairs of data be stored in increments of 10° C. in a temperature range from −30° C.~80° C. The base station 13 sets the temperature in the thermoregulator 18 and determines whether or not the internal temperature is stabilized based on the temperature informa-tion, and when deciding that the set or predetermined temperature is reached, the base station 13 transmits a predetermined code which instructs a pair of data to be stored.

Figure 10:
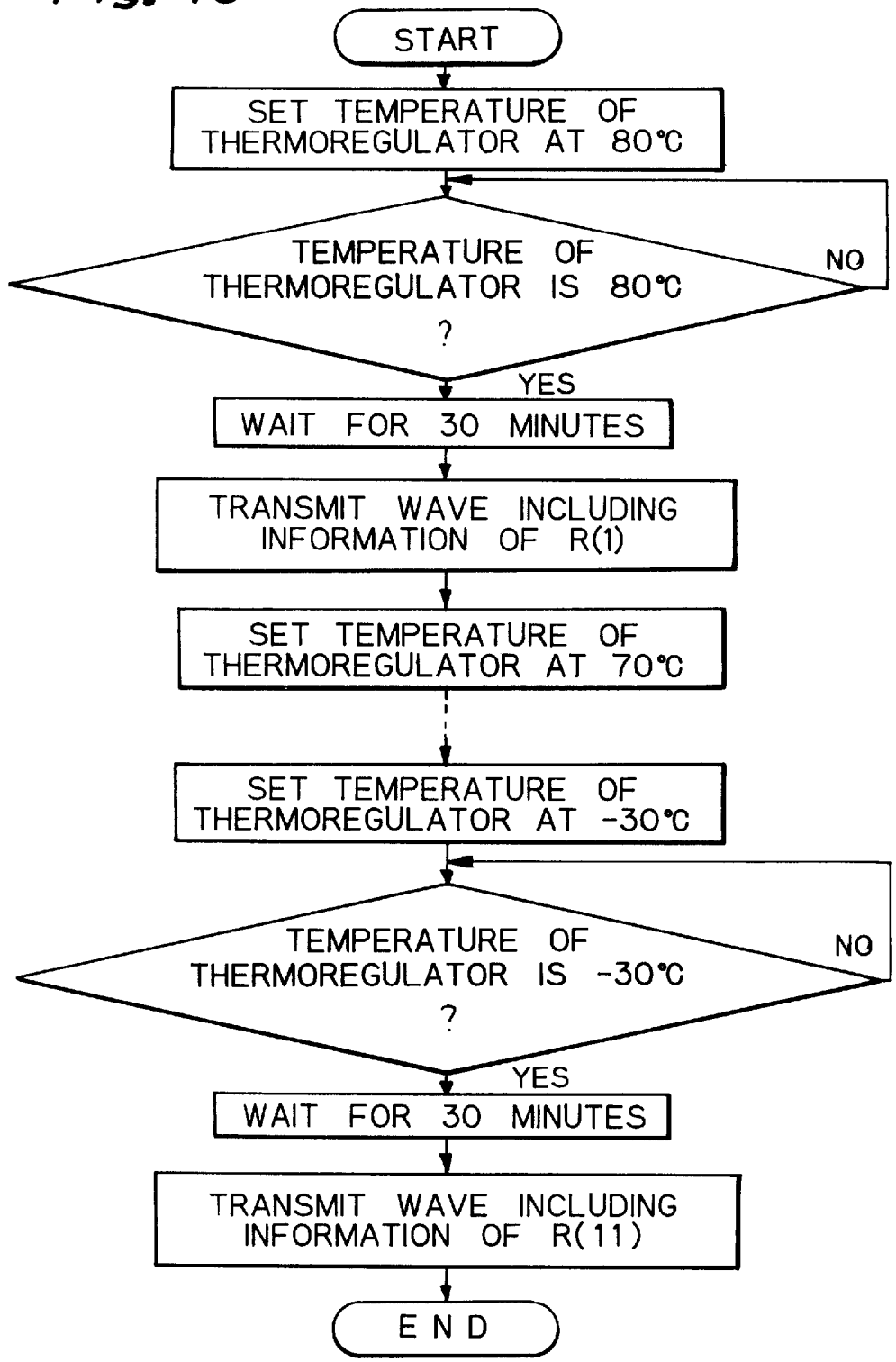
FIG. 10 is a flow chart showing the process performed in a base station of the embodiment shown in FIG. 7.

For instance, the base station 13 processes in a procedure as shown in FIG. 10. First, the temperature of the thermoregulator is set at 80° C. NExt, it is decided whether or not the temperature of the thermoregulator has reached 80° C. When the temperature reaches 80° C., there is a wait of 30 minutes. Then, the base station transmits a wave including the received information of R(1). This procedure is repeated with respect to 70° C., . . . −30° C.

At the same time, the demodulator 3 of the radio communication apparatus demodulates this code and outputs it to the CPU 9, which causes the memory element 10 to store the pair of data on receipt of the code.

Figure 11:
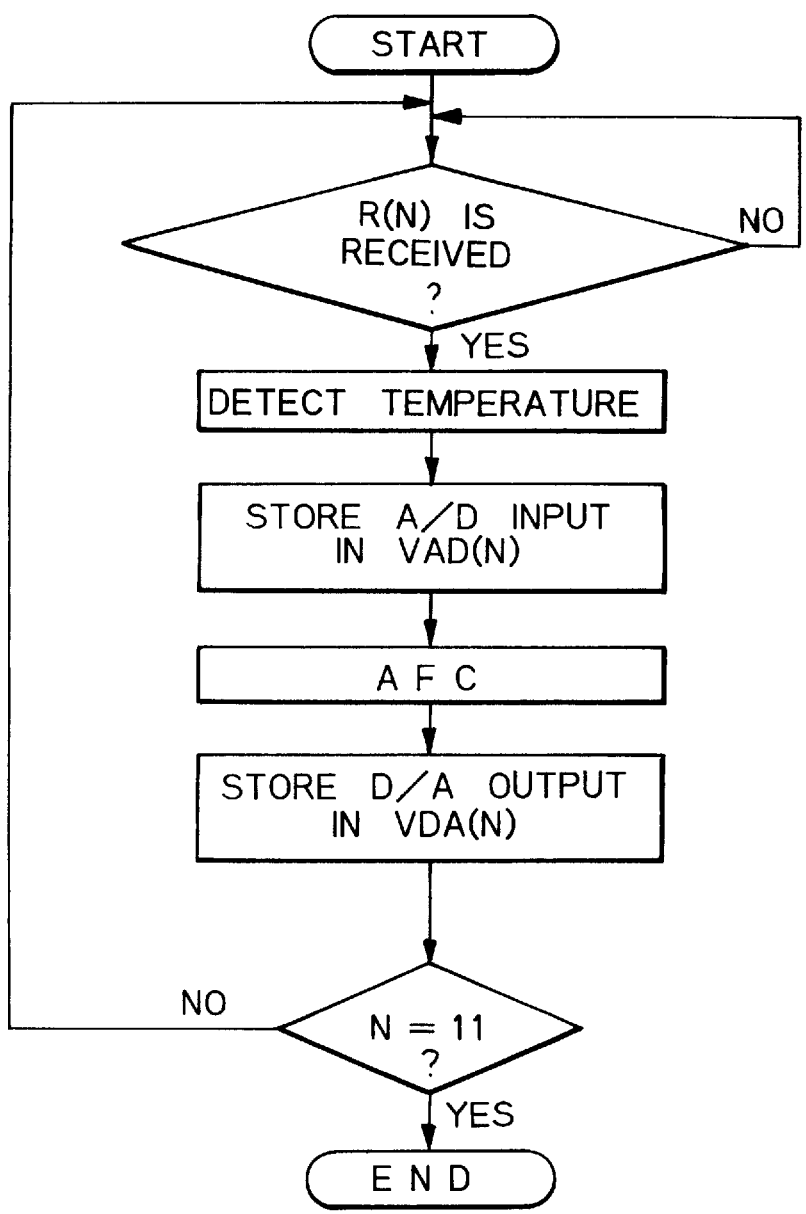
FIG. 11 is a flow chart showing the process performed in the second embodiment.

For instance, the radio device processes in a procedure as shown in FIG. 11. First, it is determined whether or not R(N) has been received. If it has been received, then the temperature is detected. Next, an A/D input value is stored in VAD(N). Next, AFC (Automatic Frequency Control) processing is carried out. Further, a D/A output value is stored in VDA(N). Next, a value for N is investigated, and if N=11, the process is completed.

Here, the value of R(N) may be selected so that R(1)=R(2)=. . . =R. In this case, the process is carried out in a certain procedure, for instance, in the order of 1, 2, . . . 11 as shown in FIG. 9, or the predetermined number of data are first stored and thereafter the data should be brought into alignment in such an order.

According to the second embodiment, the adjustment may be made easy because the setting of temperature of the thermoregulator 18 and the storing instruction of pairs of data are automatically made. Further, the switching between the adjustment and control modes may be carried out by using the signal $f_{RX}$.

Figure 12:
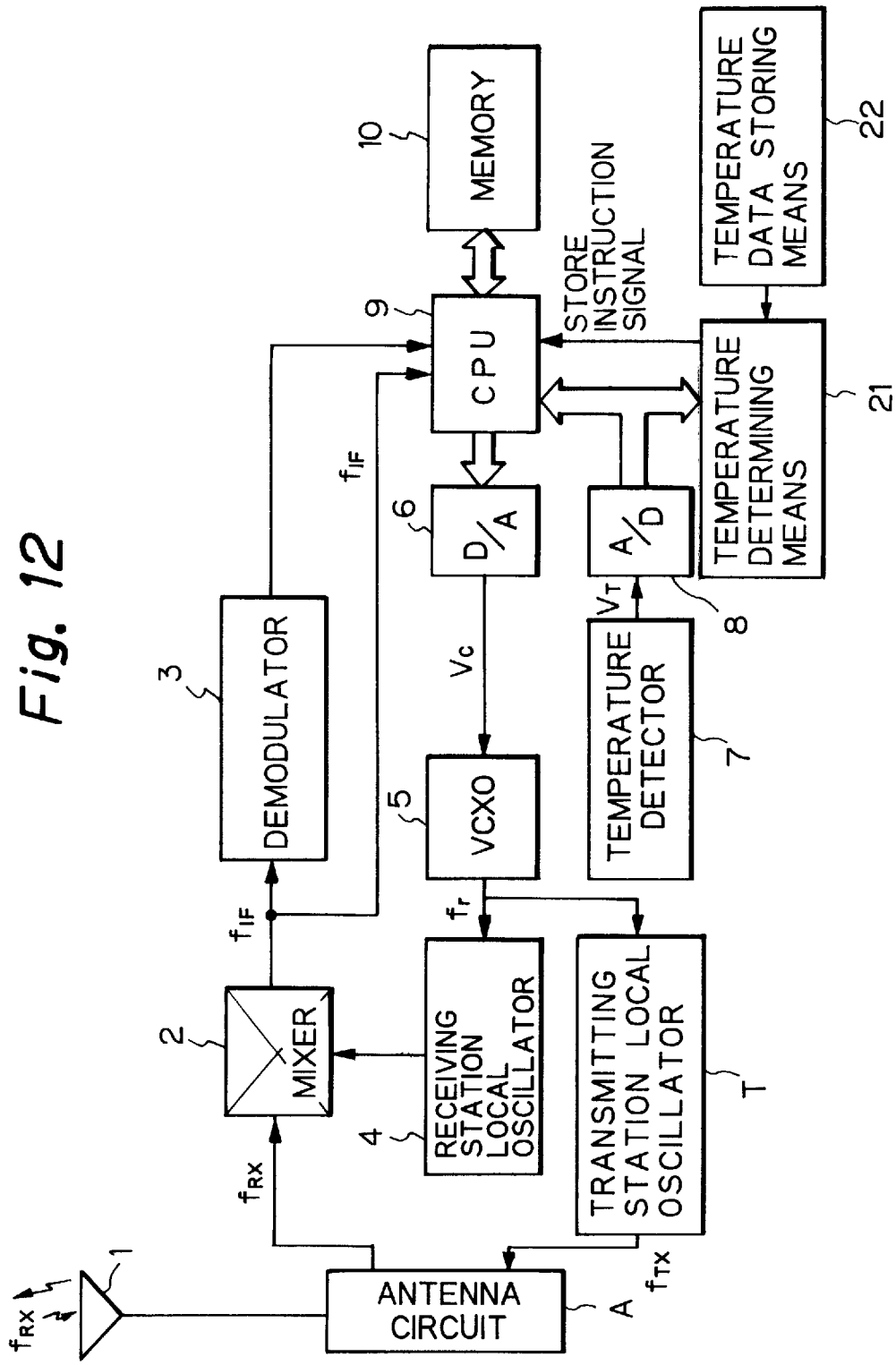
FIG. 12 is a functional block diagram of another radio communication apparatus according to the present invention.

Furthermore, as shown in FIG. 12, a transmitting station local oscillation source T and an antenna circuit A may be added to the radio communication apparatus. A duplexer, an antenna switch and the like are employed in the antenna circuit A. The antenna circuit A is intended to feed a transmitting wave to the antenna and a received wave to the mixer, respectively.

The apparatus shown in FIG. 12 is adjusted in the following procedure:

(1) Set the temperature of the thermoregulator at a certain temperature and wait until the temperature gets stabilized;
(2) The base station instructs the apparatus to start transmission, and this instruction may be given in a wired or wireless fashion;
(3) The base station detects the frequency of the transmitting wave and gives the information to the apparatus, and the transmitting wave and the information also may be transmitted through wired of wireless communication;
(4) The apparatus changes the frequency of the VCXO based on the information and outputs a transmitting wave again, and operations of the items (3) and (4) are repeated until the transmitting frequency falls within a predetermined range; and
(5) When the frequency falls within the predetermined range, the base station instructs the apparatus to store the temperature information and D/A output information.

Pairs of data are stored as described above.

Next, a third embodiment will be described.

In the adjustment carried out in the apparatus according to the second embodiment, a period of time ranging from ten's of minutes to several hours is required from the time when the thermoregulator 18 is set at the predetermined temperature until the time when the temperature stays constant at such a set temperature. For instance, a case is taken into consideration in which the adjustment is carried out in increments of 10° C. in a temperature range of −30° C.~80° C. Assuming that the temperature of the thermoregulator 18 stays stable at 80° C., the temperature is then reset at 70° C. A temperature indicator of the thermoregulator 18 soon indicates a temperature of 70° C., but at this actual moment the interior of the thermostatic oven is not entirely cooled to that temperature. The temperature at the temperature detecting portion in the oven is only decreased to such a temperature. Ten's of minutes is needed before the internal temperature of the oven becomes 70° C. uniformly throughout the oven, and further ten's of minutes are required before the respective apparatuses 17 in the oven are cooled to 70° C. Therefore, a period of time in the order of ten's of hours is needed before adjustment is completed.

According to the third embodiment, in order to reduce the time required for adjustment, for instance, if a required frequency accuracy is obtained when the adjustment is carried out in increments of 10° C. in the temperature range of −30° C.~80° C., the actual adjustment may be carried out based on the readings of the temperature indicator in increments of a temperature which is slightly less than 10° C. in a temperature range of −40° C.~90° C.

This is due to the following reasons. When the temperature indicator of the thermostatic oven shows 90° C., the temperature of the respective apparatuses in the thermostatic oven is expected to be equal to or higher than 80° C., while the temperature indicator shows −40° C., the temperature of the same apparatuses is expected to be equal to or less than −30° C. Therefore, if adjustment is carried out in the range of −40° C.~90° C., it is possible to cover the required temperature range of −30° C.~80° C.

In addition, if the temperature of the thermoregulator 18 is indicated at intervals of a temperature which is slightly less than 10° C., the actual intervals of temperature in the radio apparatus 17 is expected to be less than 10° C., and therefore if adjustment is carried out at intervals of a temperature which is slightly less than 10° C., it is possible to adjust at required temperature intervals of 10° C.

Next, a fourth embodiment will be described.

In the apparatus according to the second embodiment, in order to give a timing to store a pair of data in the adjustment mode, an operation from the outside of the oven 18 is needed.

In accordance with the fourth embodiment, separately from the method described in the third embodiment there is another method for reducing the time required for the adjustment in which the respective radio communication apparatuses individually take a timing to store a pair of data based only on information that is provided by the temperature detecting means in the apparatus. According to this method, there is no need to maintain the temperature of the thermostatic oven at a certain level, and this allows the temperature inside the oven to be continuously changed while adjustment is being carried out, thereby making it possible to remarkably reduce the time required for the adjustment. Furthermore, this obviates the necessity of giving a timing to store a pair of data from the outside, thereby improving the efficiency of adjustment work.

Figure 13:
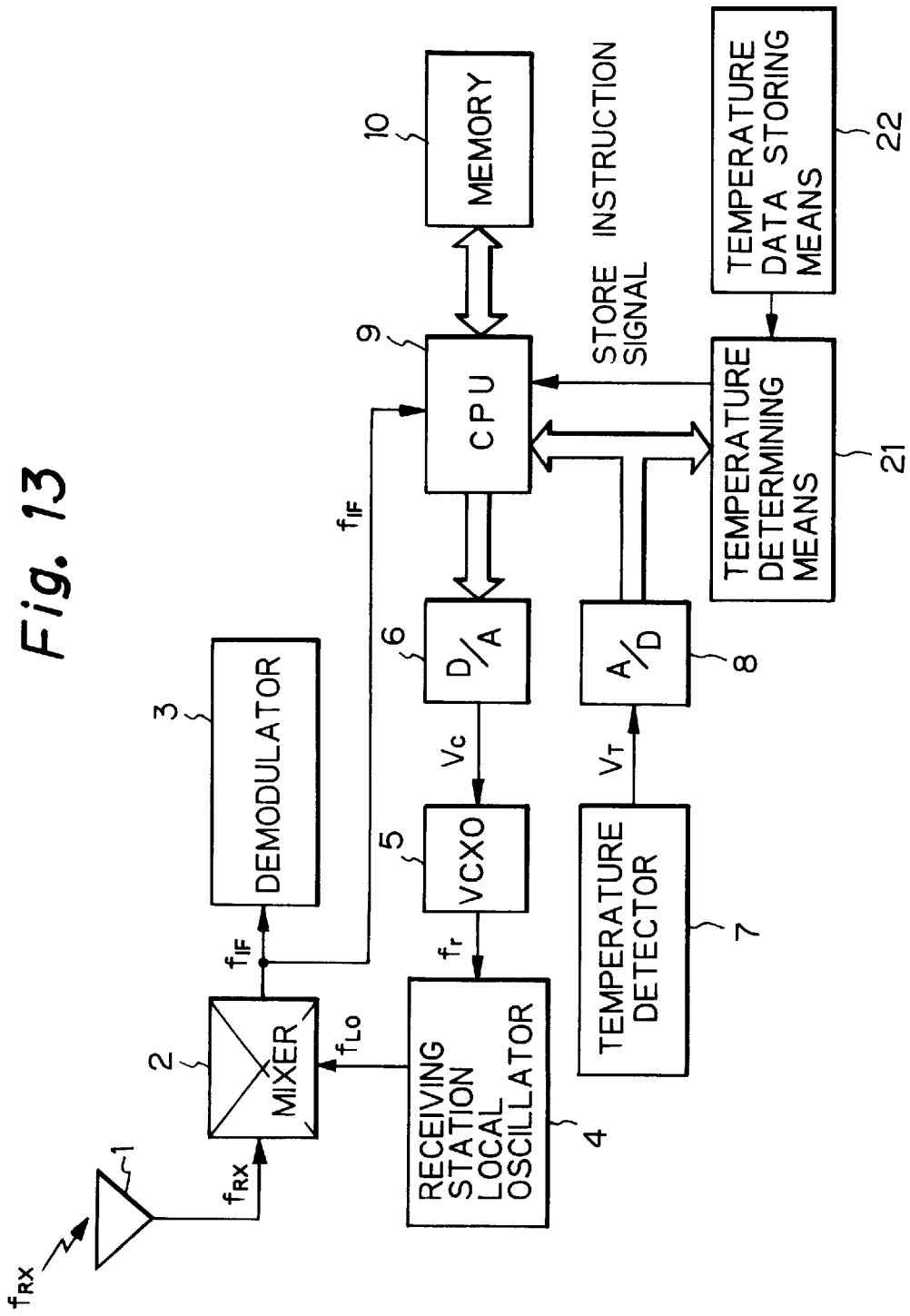
FIG. 13 is a functional block diagram of a radio communication apparatus according to another embodiment of the present invention.

FIG. 13 is a functional block diagram of a radio apparatus according to the fourth embodiment in which the above mentioned adjusting method can be realized. In FIG. 13, reference numeral 21 denotes a temperature determining means for comparing temperature data stored in advance in a temperature data storing means 22 with temperature data provided by an A/D converter 8 and outputting a pair of data storing instruction signal to a CPU 9 when it is decided that the compared temperature data coincide with each other. An antenna 1, a mixer 2, a demodulator 3, a receiving station local oscillation source 4, a VCXO 5, a D/A converter 6, a temperature detecting circuit 7, the A/D converter 8, the CPU 9 and a memory element 10 are similar or corresponding to those constituent components shown in FIG. 6.

Figure 14:
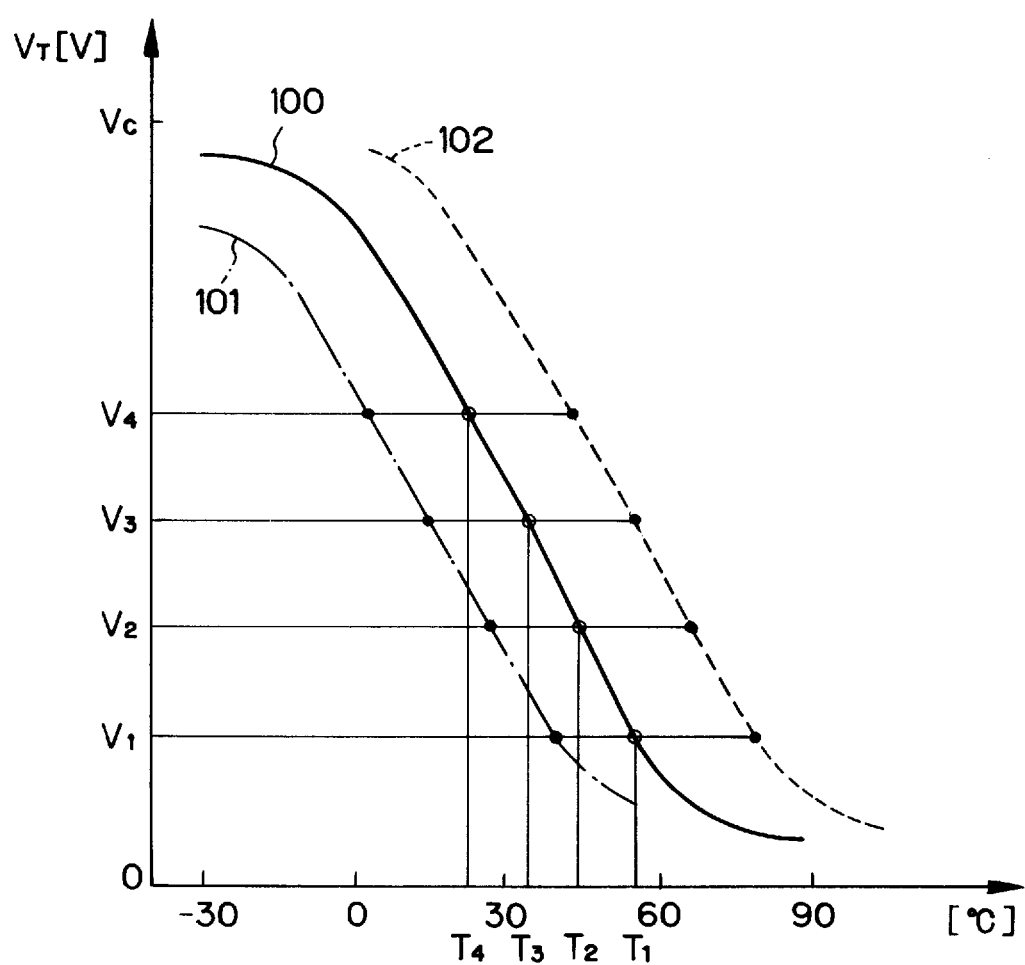
FIG. 14 shows characteristics of a temperature detecting circuit of the apparatus shown in FIG. 13.

Next, referring to FIG. 9, the operation will be described. The temperature detecting circuit 7 in FIG. 13 is, for instance, of the same construction as that of the temperature detecting circuit 7 of the conventional device shown in FIG. 1. In addition, this temperature detecting circuit 7 has, for instance, voltage-temperature characteristics as shown in FIG. 14. As is clear from the same diagram, the temperature inside the radio apparatus and the output voltage value (a digital output value from the A/D converter 8) of the temperature detecting circuit 7 are uniquely correspond to each other, that is, they are in the relationship of 1 to 1 correspondence in the characteristic curve 100. Then, voltage values (for instance, $V_1$, $V_2$, $V_3$, $V_4$) corresponding to temperatures at which pairs of data are to be stored are stored in advance in the temperature data storing means 22 as digital values, and in the adjustment mode, when the temperature determining means 21 compares the output digital value from the A/D converter 8 with the digital value stored in the temperature data storing means 22 and when they coincide with each other, produces a pair of data storing instruction signal. With a configuration like this, pairs of data at temperatures $T_1$, $T_2$, $T_3$, $T_4$ shown in FIG. 14 can thus be stored independently by the radio apparatus itself.

In addition, in a situation in which $f_{RX}$ is fed into the inside of the thermostatic oven, the adjustment can be performed by simply changing the temperature of the thermostatic oven in a continuous fashion with the radio apparatus set in the adjustment mode being placed in the thermostatic oven.

Due to variation in the characteristics of a thermistor 701 there is variation in the voltage-temperature characteristics in each radio apparatus as is shown in FIG. 14, this results in the generation of a problem that an accurate corresponding relation cannot be established between the digital values $V_1$, $V_2$, $V_3$, $V_4$ stored to take a timing to store pairs of data and temperatures $T_1$, $T_2$, $T_3$, $T_4$ at which pairs of data are to be stored. However, as is described above, this problem can be solved by setting the digital values for taking a timing to store pairs of data so wide and close that such variations can be neglected and having a wider temperature range within which the temperature is changed for adjustment.

Next, a fifth embodiment will be described.

Figure 15:
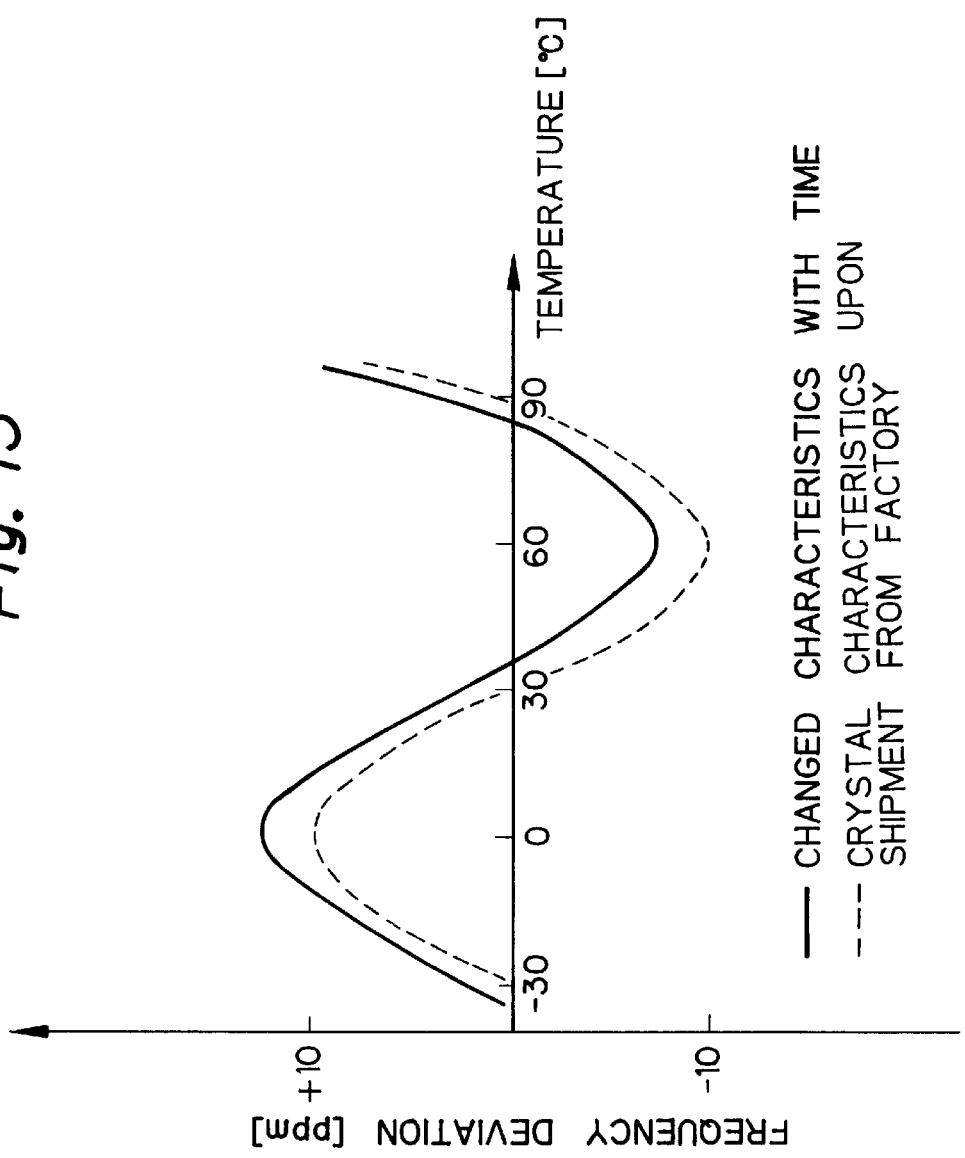
FIG. 15 shows the variation of characteristics of a crystal with age.

There is an issue of aging of characteristics of a crystal used in the VCXO, that is the characteristics may change with time. This means variation with time in the resonant frequency of the crystal and it is usually specified in the standard or rating thereof. An example of this variation with time is shown in FIG. 15. In FIG. 15, a curve indicated in a dotted line shows the characteristics of a crystal when it is shipped from a factory, while a curve indicated in a solid line shows the characteristics of a crystal that has changed with time and it is slightly offset in a positive frequency error direction relative to the curve shown in the dotted line. This offset is the result of aging. FIG. 16 shows a group of pairs of data of a radio communication apparatus incorporating a crystal having the characteristics shown in FIG. 15 as a constituent element of the VCXO. A/D input values shown in the left-hand column in the table shown in FIG. 16 are temperature data which the CPU 9 receives from the A/D converter 8, and D/A input values shown in the right-hand column are data corresponding to control voltages $V_c$ that the D/A converter 6 outputs to the VCXO 5 at those temperatures. FIG. 16 shows 11 pairs of data in total. At this time, the intermediate-frequency signal $f_{IF}$ is adjusted to a correct frequency by the output voltage $V_c$ from the VCXO 5.

It is easily appreciated that this change due to aging of the crystal causes the deviation of the frequency of the reference signal generated by the VCXO. This in turn causes the change in the transmitting frequency, as well as the local oscillation frequency of the radio apparatus, and they affect various performances of the radio device, which are not preferable.

The radio apparatus operates, as is described above, in adjustment and control modes, and when it is shipped from a factory, adjustment data for the oscillation frequency of the reference frequency generating source are accumulated or stored therein in the adjustment mode, and in the actual field (when in use) in the control mode the radio apparatus controls the oscillation frequency of the reference frequency generating source based on the accumulated data. However, as is described above, the radio apparatus is subject to variation in frequency as a result of gain. This problem can, however, be solved in the control mode in the actual field by putting the radio apparatus in the adjustment mode sometimes when the receiving field strength is stronger than a predetermined level so as to rewrite the pairs of data by using a received signal from the base station as a reference. It is usual that a portable telephone system has a function to measure the receiving field strength. A standard for the receiving frequency of a portable telephone, in other words, the transmitting frequency of the base station is usually more restricted than that for the portable telephone, and there is no problem in treating it as a proper frequency. In addition, the reason why the adjustment is carried out when the receiving field strength is strong is because detection of frequencies should be securely performed and because there may be noise when the receiving field strength is weak, leading to an error in frequency detection.

The adjustment in the actual field is carried out as will be described below.

(1) In a state in which it is affected by aging, the radio apparatus is put into the frequency adjusting mode when a good condition is available where the field strength is high in the actual field (when in the control mode). Suppose that a pair of data (125, 120) are obtained at that time. In FIG. 16, a pair of data designated as No. 6 are (125, 125), and they correspond to the pair of data (125, 120) obtained in the actual field. Then, if the data designated as No. 6 are rewritten with the pair of data (125, 120), it means that the influence of aging is canceled at least in the temperature area covered by the pair of data of No. 6. Therefore, the influence from the aging of the crystal can be eliminated at the temperature at which the radio apparatus is actually used frequently.

(2) Next, suppose that there is another pair of data (120, 120) obtained in a similar manner. In this case, there is shown in the table in FIG. 16 no similar data. Since most close thereto are the data designated as No. 6, there may be a way in which the data (120, 120) are rewritten with the data of No. 6.

In this case, since it is possible to write a pair of data irrespective of what the actual temperature is, it is possible to very often carry out rewriting in the adjustment mode while the radio apparatus is in the control mode, thereby making it possible to restrain the influence by aging more effectively. However, since A/D input values, in other words, temperatures between before and after the rewriting become different from each other, there may be a case in which an error may be caused in the temperature correction carried out by the CPU 9. To cope with this, when rewriting is carried out, a restriction is provided between the original A/D input value and the post-rewriting A/D input value, and rewriting of a pair of data is designed to be carried out only when the difference between the two input values stays within a certain range (in the above case, the rewriting of the No. 6 data is allowed only when the difference stays within 125+5).

(3) By the way, the aging characteristic of the crystal is exhibited as a vertical deviation (variation in the direction of the frequency deviation axis) as indicated by the example shown in FIG. 15, and in most cases the degree of variation is constant over the entirety of a temperature range.

Therefore, if an offset amount at a single temperature is measured, offset amounts at all the other temperatures can be known. Thus, in either of the rewriting methods (1) and (2) above, an offset amount at a single temperature is obtained, and if all the D/A output values are rewritten based on what is measured, it is possible to correct variations with time over the entirety of a temperature range.

For instance, there may be the following methods as a method for setting a timing to rewrite data by performing an AFC:

(1) Provision of a timer function on a portable telephone (radio apparatus)

The timer detects a lapse of a certain period of time (for instance half a year) and performs AFC so as to rewrite data when the field strength is strong. In addition, the field strength is measured by means of a function (RSSI: Received Signal Strength Indicator) for measuring a predetermined field strength.

(2) AFC is carried out when the field strength is strong so as to generate a new pair of data, and this pair of data are compared with a group of pairs of data generated at the time of manufacturing, and only when the difference between D/A output values is great, data rewriting is performed.

For instance, suppose that original A/D values are . . . , 150, 170, . . . , while D/A values are . . . , 100, 120, . . . . On the other hand, suppose that data obtained in the actual field are (160, 105). If a calculation is carried out based on the group of original pairs of data, a pair (160, 110) is obtained. Thus, the difference between the pairs is 5. For instance, it is constructed such that if the difference exceeds this difference of 5, rewriting is performed.

Next, a sixth embodiment will be described.

Figure 17:
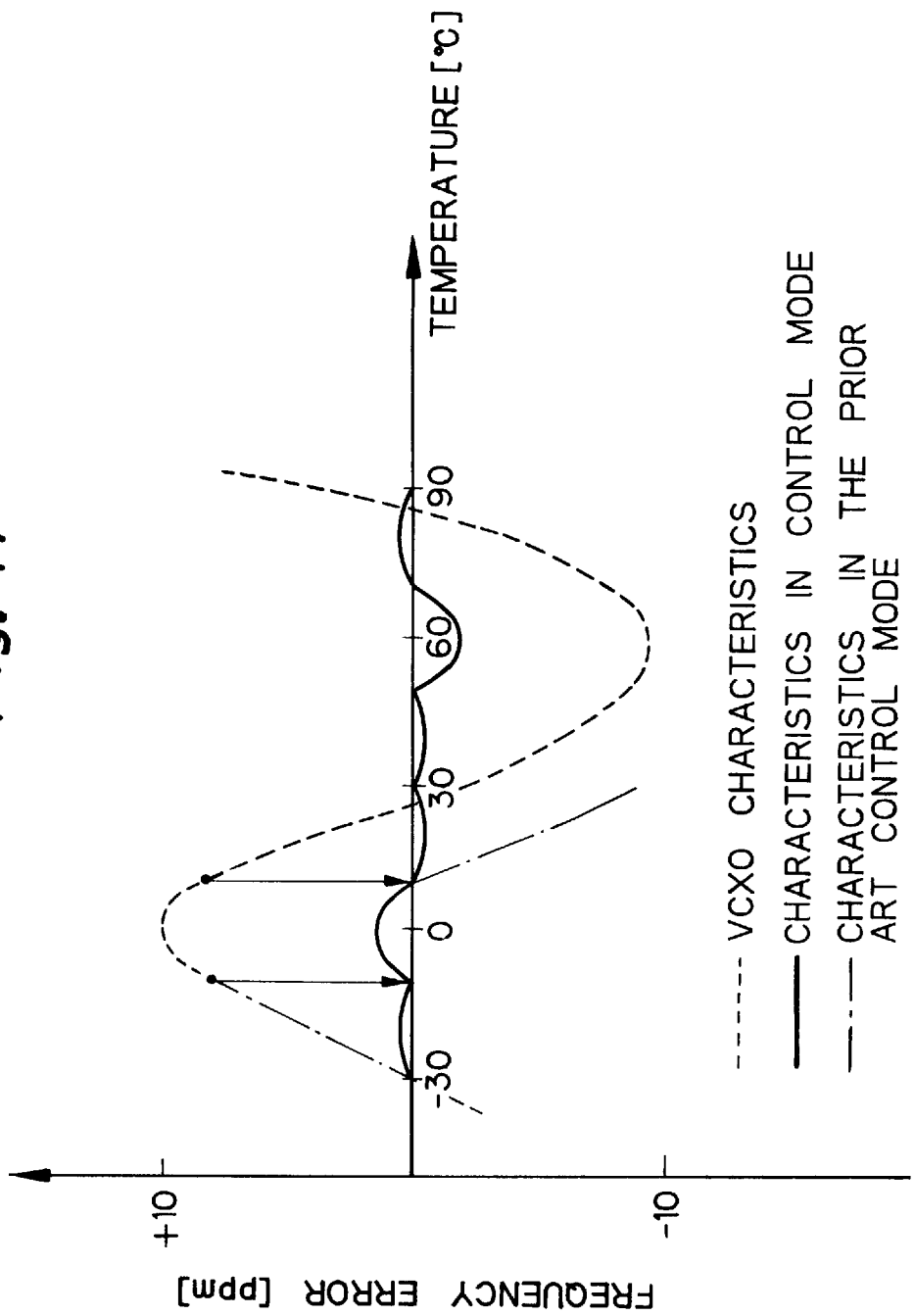
FIG. 17 is a diagram showing a reference frequency-temperature characteristic obtained after an apparatus according to another embodiment of the present invention has been corrected.

The number of pairs of data that the CPU 9 of the radio apparatus has to store in order to perform temperature compensation is desirably as small as possible. However, if the number becomes too small, the temperature correction to be carried out becomes rough, with the result that a suitable correction cannot be performed. For instance, as shown in FIG. 17, if no correction is carried out in a range from a certain temperature at which a pair of data are stored to another temperature at which another pair of data are stored, as shown in a curve indicated by a chain line in FIG. 17, ends of a curve showing the temperature variation appears as it is and it is not possible to carry out fine corrections.

To deal with this, if approximation is conducted between a temperature at which a certain pair of data are adjusted and a temperature at which the next pair of data are adjusted, it is possible to perform corrections with good accuracy.

A/D input values and D/A output values when corrections are performed on the assumption that they vary in a linear fashion between adjacent temperatures where adjustment is conducted are shown in FIG. 18. In FIG. 18, linear approximation is performed on A/D input values and D/A output values between pairs of data designated as Nos. 1 and 2. A relationship of frequency error-temperature at that time is indicated by the solid line in FIG. 17. As is seen from FIG. 17, the frequency error is remarkably reduced.

In addition, in the embodiments 1 to 6 above, although the descriptions are made by taking as an example the receiving operation of the radio apparatus, it is needless to say that these examples can be applied to a transmitting operation of the radio apparatus.

As is described above, according to the first feature of the invention, since the radio apparatus comprises an antenna, a mixer for mixing a received signal from the antenna and a local oscillation signal applied from the outside so as to produce an intermediate-frequency signal, a demodulator for detecting a signal based on the intermediate-frequency signal, a control section for detecting the frequency of the intermediate-frequency signal so as to produce a control signal, a reference signal generator for generating a reference signal under the control of the control section and a local oscillation signal generator for generating the local oscillation signal based on the reference signal for supply to said mixer, it is advantageous in that the radio apparatus is free from the influence of temperature variations in the demodulator, thus enabling high stability to be attained.

In addition, according to the second feature of the invention, since the radio apparatus further comprises a temperature detecting means for detecting an internal temperature and supplying a temperature signal to the control section, wherein in an adjustment mode the control section stores the control signal supplied to the reference signal generator and the temperature signal applied from the temperature detecting means as a pair of data when the frequency of the intermediate-frequency signal falls within a predetermined range, while in a control mode the control section controls the frequency of the reference signal while performing temperature compensation based on the pair of data, it is possible to further suppress the influences resulting from temperature variations.

Furthermore, according to the third feature of the invention, in the radio apparatus since the control section is constructed such that the control signal supplied to the reference signal generator and the temperature signal generated by the temperature detecting means are stored as a pair of data when a demodulation signal received from the demodulator and a predetermined signal coincide with each other, no cable connected to the radio device is needed at the time of adjustment, and thus the radio apparatus is further advantageous in that the adjustment process can be simplified.

Moreover, according to the fourth feature of the invention, since the radio apparatus further comprises a temperature data storing means in which temperature data is stored in advance and a temperature determining means for outputting a pair-of-data storing instruction signal for storing the control signal supplied to the reference signal generator and the temperature signal generated by the temperature detecting means as a pair of data when comparing the temperature data with the temperature signal and deciding that those two signals coincide with each other, there is no need to give a pair-of-data storing instruction signals from the outside of the radio apparatus, and thus it is also advantageously enables the adjustment process to be simplified.

In addition, according to the fifth feature of the invention, in the radio apparatus, since the control section is constructed so as to be temporarily put in the adjustment mode in the actual field, and wherein it is also constructed such that the pair of data are rewritten by the control signal supplied to the reference signal generator and the temperature signal generated by the temperature detecting means which are received from a base station with respect to the received radio waves in the adjustment mode, it is further possible to reduce influence due to aging.

Furthermore, according the sixth feature of the invention, in the radio device, since the control section is constructed so as to perform temperature compensation by carrying out an interpolating treatment based on the stored pair of data when there is no pair of data corresponding to the temperature signal, it is possible to perform temperature compensation in an accurate manner.

In addition, according to the seventh feature of invention, since the method for adjusting the radio apparatus comprises the steps of increasing or decreasing the internal temperature of a thermoregulator to a predetermined value, determining whether or not the internal temperature of the thermoregulator reaches the predetermined temperature, instructing from a base station disposed outside of the thermoregulator a plurality of radio apparatus placed in the thermoregulator to store a pair of data upon reaching the predetermined temperature, transmitting signals from the base station to the plurality of radio apparatus and setting the temperature of the thermoregulator from the base station, no cable that is connected to the radio device is needed at the time of adjustment, and hence it is advantageous in that the adjustment process can be simplified.

Furthermore, according to the eighth feature of the invention, since the adjustment is performed in a temperature range wider than a required temperature range, it is possible to reduce a time required for adjustment.

On the basis of the described preferred embodiments of the present invention, it will be apparent to those skilled in the art that many changes and modifications may be made without from the concepts of the invention.

What is claimed is:

1. A radio communication apparatus, comprising:

an antenna;

a mixer for mixing a received signal from said antenna with an externally supplied local oscillation signal to produce an intermediate-frequency signal;

a demodulator for demodulating said intermediate-frequency signal to obtain a communication signal;

a control section for detecting the frequency of said intermediate-frequency signal and outputting a control signal based on the detected frequency of said intermediate-frequency signal;

a reference signal generator for generating a reference signal under the control of said control signal; and a local oscillation signal generator for generating said externally supplied local oscillation signal based on said reference signal;

wherein said control section receives the demodulated communication signal from said demodulator, and stores said control signal and a signal representative of a characteristic of said apparatus as a pair of data when said demodulated signal coincides with a predetermined value, said control section generating said control signal based on said pair of data.

2. A radio communication apparatus as set forth in claim 1 further comprising temperature detecting means for detecting the internal temperature and applying the temperature signal to said control section, wherein in an adjustment mode, said control section stores said control signal supplied to said reference signal generator and said temperature signal supplied from said temperature detecting means as said pair of data when the frequency of said intermediate-frequency signal falls within a predetermined range, while in a control mode, said control section controls the frequency of said reference signal while performing temperature compensation based on said pair of data.

3. A radio communication apparatus as set forth in claim 2 further comprising temperature data storing means in which temperature data is stored in advance, and temperature determining means for comparing said temperature data with said temperature signal and outputting a pair-of-data storing instruction signal by which said control signal supplied to said reference signal generator and said temperature signal supplied from said temperature detecting means are stored as a pair of data when said compared two signals coincide with each other.

4. A radio communication apparatus as set forth in claim 2, wherein said control section is constructed so as to be temporarily put in the adjustment mode in the actual field, and wherein said pair of data are rewritten by said control signal supplied to said reference signal generator and said temperature signal from said temperature detecting means which are obtained on the basis of radio waves received from a base station in the adjustment mode.

5. A radio communication apparatus as set forth in claim 2, wherein said control section performs temperature compensation by carrying out an interpolating process based on said stored pair of data when there is no pair of data corresponding to said temperature signal.

6. A radio communication apparatus as set forth in claim 1, wherein the characteristic of said apparatus is the internal temperature of the apparatus.

7. A method for adjusting a radio communication apparatus comprising the steps of:

altering the internal temperature of a thermoregulator to a predetermined value, determining when said internal temperature reaches said predetermined value, transmitting a signal to a base station disposed outside of said thermoregulator indicating that said internal temperature has reached said predetermined value, instructing a plurality of radio communication apparatus disposed in said thermoregulator from said base station to store a pair of data relating to operational parameters of said plurality of apparatus upon said base station receiving said transmitted signal, transmitting signals from said base station to said plurality of apparatus, and setting the temperature of said thermoregulator from said base station.

8. An adjusting method as set forth in claim 7, wherein the adjustment is performed in a temperature range wider than a required temperature range.

9. A method as set forth in claim 7, wherein each of said plurality of radio communication apparatus includes temperature data storing means in which temperature data is stored in advance, and temperature determining means for comparing said temperature data with a temperature signal representative of the internal temperature of each respective apparatus, and outputting a pair-of-data storing instruction signal by which a control signal supplied to a reference generator and said temperature signal are stored as said pair of data when said temperature data and said temperature signal coincide.

* * * * *

UNITED STATES PATENT AND TRADEMARK OFFICE
CERTIFICATE OF CORRECTION

PATENT NO. : 5,774,800
DATED : June 30, 1998
INVENTOR(S) : Kazuhiro Mori

Figure 2:
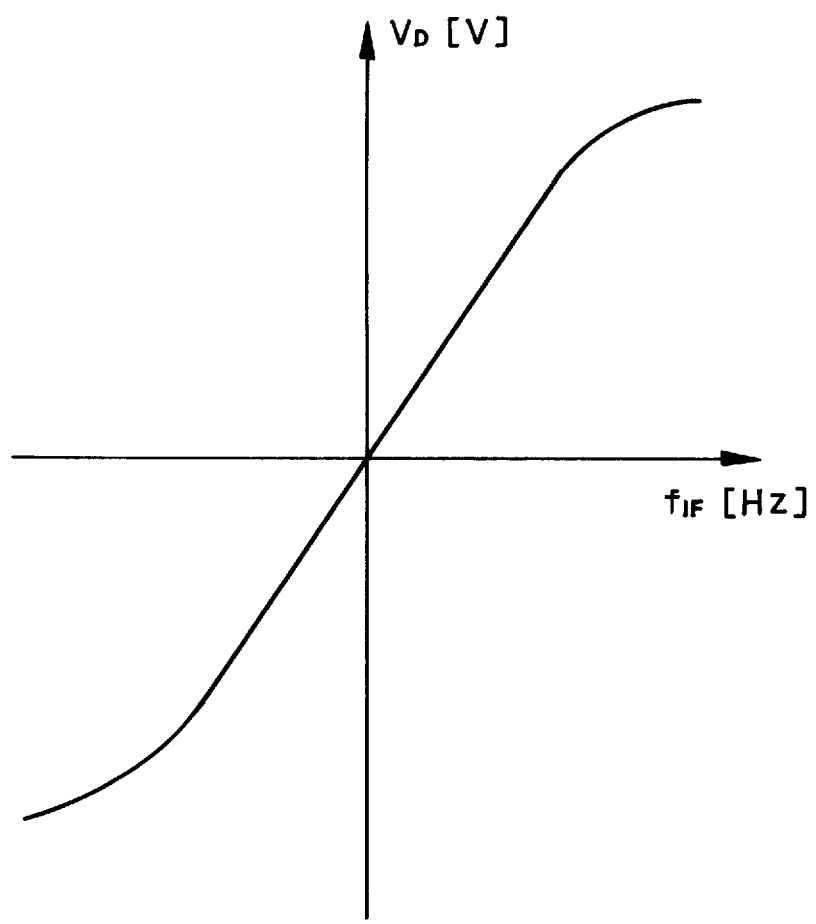
FIG. 2 shows characteristics of a demodulator of the conventional radio communication apparatus.
Figure 3:
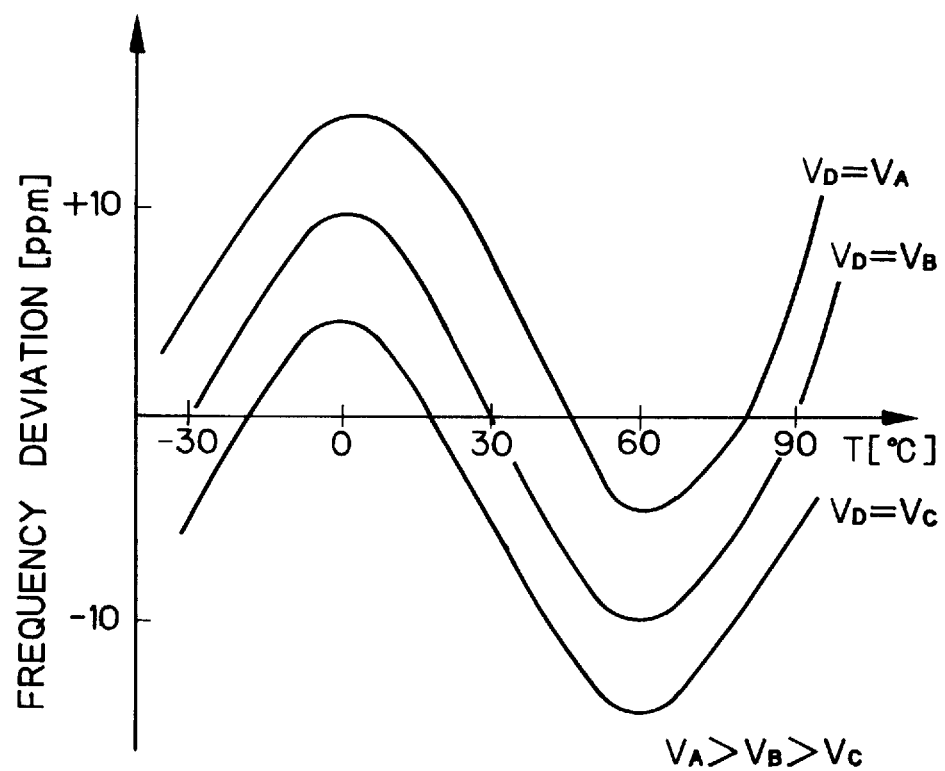
FIG. 3 shows characteristics of a VCXO used in the conventional apparatus.
Figure 4:
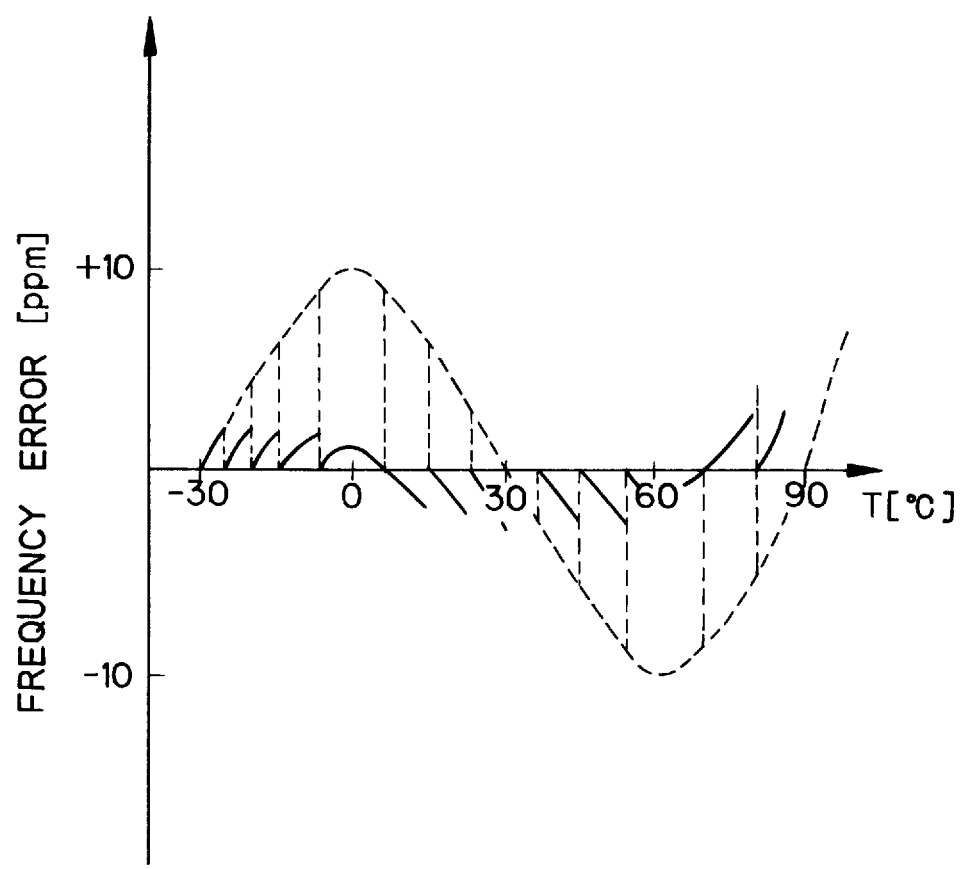
FIG. 4 shows characteristics of the conventional radio communication apparatus in the control mode.
Figure 5:
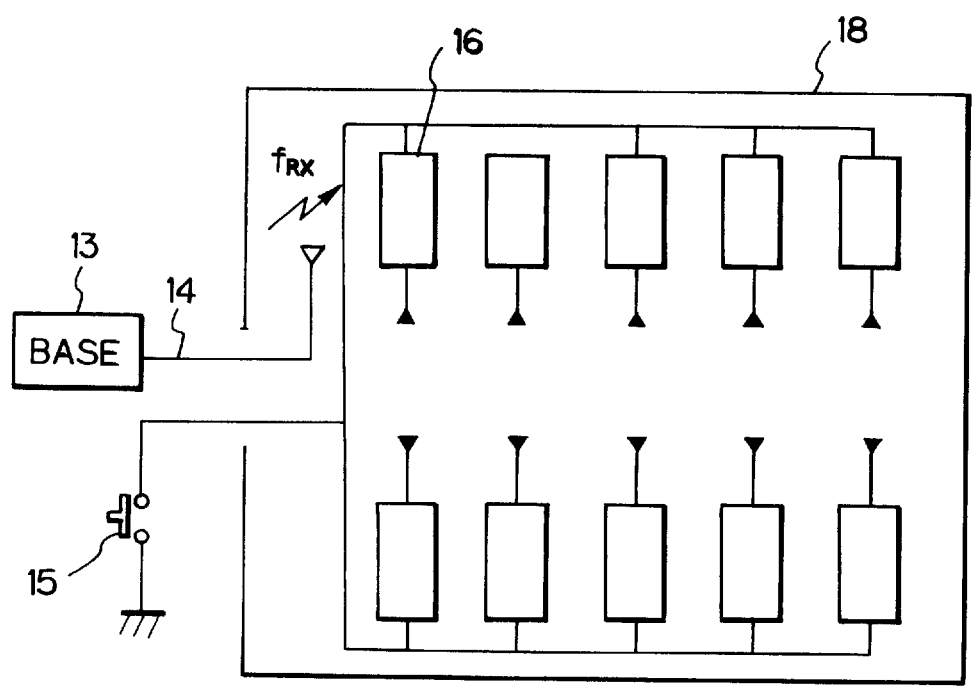
FIG. 5 is a diagram for illustrating an adjustment method for the conventional radio apparatus.

It is certified that error appears in the above-indentified patent and that said Letters Patent is hereby corrected as shown below:

<u>In the Figures:</u> In Fig. 2, thru Fig. 5, add
-- Prior Art --;

Col. 3, line 1, "$V_G$" should be -- $V_C$ --.

Signed and Sealed this

Twenty-sixth Day of October, 1999

Attest:

Q. TODD DICKINSON

*Attesting Officer*   *Acting Commissioner of Patents and Trademarks*